United States Statutory Invention Registration [19]

[11] Reg. Number: H436

Milberger et al. [43] Published: Feb. 2, 1988

[54] LASER DIODE MODULATOR

[75] Inventors: Walter E. Milberger, Severna Park; Charles S. Kerfoot, Pasadena, both of Md.

[73] Assignee: The United States of America as represented by the Secretary of the Army, Washington, D.C.

[21] Appl. No.: 89,198

[22] Filed: Aug. 21, 1987

[51] Int. Cl.[4] ..... H01S 3/00; H01S 3/10

[52] U.S. Cl. ..... 372/38; 372/25

*Primary Examiner*—Stephen C. Buczinski
*Assistant Examiner*—Linda J. Wallace
*Attorney, Agent, or Firm*—Sheldon Kanars; Jeremiah G. Murray; John K. Mullarney

[57] ABSTRACT

A low voltage trigger pulse is coupled to a three-stage driver which generates therefrom a high amplitude (e.g., 20 amp.) decaying current spike of predetermined width. The current pulse or spike from the driver is coupled to the gates of a multiplicity (i.e., 12) of parallel-connected field effect transistors (FETs) to turn or switch the same to the "ON" state. A laser diode array is series-connected with the parallel connected FETs so that when the latter is switched ON a very high (100 amp.) current pulse is delivered to the laser diode array to enable the same. At the cessation of the pulser current drive, a passive pull-down technique is used to enhance the turn-off of the parallel-connected FETs so that the laser diode array is quickly disabled. A protective overload circuit sets a limit to the average current through the laser diode array without affecting the pulse burst current.

6 Claims, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

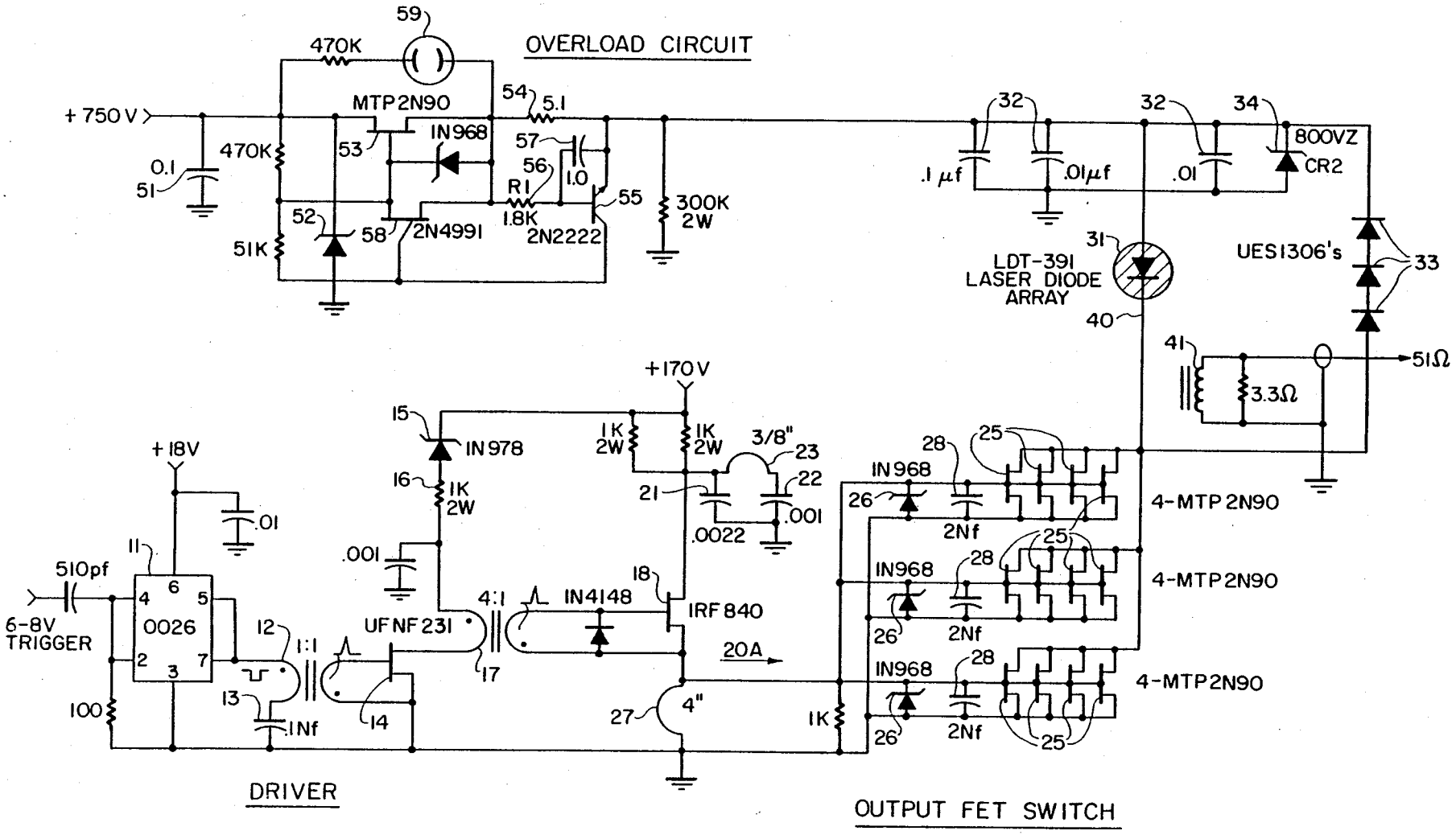
OVERLOAD CIRCUIT
OUTPUT FET SWITCH
DRIVER
LDT-391 LASER DIODE ARRAY
UES1306's
4-MTP2N90
4-MTP2N90
4-MTP2N90
800VZ
CR2
51Ω
3.3Ω
.01
.01μf
.1 μf
300K 2W
470K
MTP2N90
IN968
2N2222
2N4991
R1 1.8K
1.0
5.1
470K
51K
0.1
+750V
IN978
1K 2W
1K 2W
1K 2W
+170V
3/8"
.001
.0022
IRF840
20A
IN4148
4:1
UFNF231
1:1
1nf
4"
1K
2Nf
IN968
0026
+18V
510pf
6-8V TRIGGER
100

LASER DIODE MODULATOR

The Government has rights in this invention pursuant to Contract No. DAAK20-83-C-0390 ordered by the Department of the Army.

TECHNICAL FIELD

The present invention relates to a high current nanosecond laser diode modulator which is capable of operating at PRFs up to 100 KHz.

BACKGROUND OF THE INVENTION

The patent to W. E. Milberger (a co-inventor of the present invention), U.S. Pat. No. 4,425,518, issued Jan. 10, 1984, and the U.S. Statutory Invention Registration No. H275, published May 5, 1987, inventors W. E. Milberger et al., both disclose field effect transistor (FET) pulse apparatus which provide high voltage pulses of short duration. The pulse apparatus of Reg. No. H275 was an improvement on that of the Milberger patent in that it provided higher voltage pulses of shorter duration. Moreover, it provided pulses of very fast "fall-time" at least equal to the turn on or "rise-time." The above-noted FET pulse apparatus have proved to be quite satisfactory for their intended uses, e.g., the transmitters of ECM systems and MMW (millimeter wave) radar systems. There are, however, other and different potential uses or applications wherein the noted FET modulators are particularly unsuited. More specifically, and by way of example, laser diode arrays for light pulse transmission purposes require high current (up to 100 amperes) at high pulse repetition rates or frequencies (PRFs up to 100 KHz). Neither of the above-noted references can provide the very high current needed to pulse modulate laser diode arrays at relatively high PRFs.

Prior art, high current, laser diode pulsers have employed (artificial) line type modulators which utilized avalanche devices (SCRs, thyratrons, PNPN diodes, etc.) to discharge the line. The long recovery time of these devices restricted the PRF at which the line type modulator could operate. Additionally, the difficulty of matching the line modulator to the laser diode load often resulted in pulse ringing and/or poor pulse fall time. Because of the PRF limitations of line modulators, the full diode laser average output power could never be realized at narrow pulse widths (20–50 nanoseconds).

SUMMARY OF THE INVENTION

It is the primary object of the present invention to provide an efficient pulse modulator (for a laser diode array) which can deliver high currents (e.g. up to 100 amperes) at moderate voltages (e.g. 800 volts) over a pulse width range from 20–200 nanoseconds at PRFs up to 100 KHz.

The above and other objects are attained in accordance with the present invention wherein a conventional (low voltage) trigger pulse is utilized to initiate the high current nanosecond pulse generation operation. The trigger pulse is coupled to a (three-stage) driver which generates therefrom a high amplitude (e.g., 20 amp.) current pulse (i.e., decaying current spike) of controlled, predetermined width. The current pulse from the driver is coupled to the gates of a multiplicity of parallel-connected FETs so as to turn or switch the same to the "ON" state. A laser diode array is series-connected with parallel-connected FETs so that when the latter is switched ON a very high current (e.g. 100 amp.) is delivered to the laser diode array to thereby enable the same. At the cessation of the pulser current drive, a passive pull-down technique is used to enhance the turn-off of the parallel-connected FETs so that the laser diode array is quickly disabled.

An advantageous feature of the invention comprises a duty-sensitive overload circuit which sets a limit (e.g. 100 ma) to the average current of the laser diode array without any significant effect on pulse burst current. This average current restriction or limit is necessary in view of the high cost of the laser diode array.

BRIEF DESCRIPTION OF THE DRAWING

The single FIGURE is a detailed schematic diagram of a laser diode modulator in accordance with the principles of the present invention.

DETAILED DESCRIPTION

The pulse modulator apparatus of the present invention will first be briefly described in functional terms to provide a general understanding of the operation thereof. This will be followed by an explanation of several design features of the invention which have proved to be particularly advantageous in the production of the desired high current pulses. The design features of the laser diode overload protection circuit will also be covered.

Turning now to the drawing, a low voltage (6–8 V.) trigger pulse is applied to the input of the DS-0026 two-phase driver 11. The input on-off trigger pulses are typically of 0.1–1 μsec. duration and may be generated by conventional $T^2L$ logic, for example. The input terminals 2 and 4 of driver 11 are tied together, as are the output terminals 5 and 7. The 0026 driver 11 is a power amplifier, which is commercially available from National Semiconductor Inc., for example. A negative-going amplified replica of the input trigger appears at the output terminals 5 and 7 of driver 11. The driver output is connected to the 1:1 inverting, high frequency transformer 12. The primary of transformer 12 and the series-connected capacitance 13 provide a differentiating function and thus a positive-going one-ampere spike is delivered to the gate of FET 14.

The input spike serves to turn on the FET 14. The drain of FET 14 is coupled to a voltage source (+170 V.) via zener diode 15, resistance 16 and the primary of transformer 17. The zener 15 provides a given voltage drop and the resistance 16 is for current limiting purposes. The negative-going spike that results when the FET 14 is turned on is coupled via the 4:1 inverting transformer 17 to the gate of FET 18. The resultant positive-going three-ampere pulse or spike applied to FET 18 triggers the same to the ON state. A pulse forming network (PFN) in the drain of FET 18 is comprised of capacitances 21 and 22 and the ⅜-inch loop inductance 23. The PFN in the drain of the enabled FET 18 provides a 20 ampere decaying current spike which charges the 20 nf input capacitance (i.e., the gate-to-source input capacitance of the twelve FETs 25) up to a 20 volt level set by the distributed IN968 zeners 26. A parallel current path also charges the 4-inch (100 Nh) loop inductance 27 placed across the gate(s) of FETs 25. The purpose of inductance 27 will be described hereinafter. Three 2-nano farad capacitances 28 shunt the gate circuits of FETs 25 to nullify the feedback effects of the drain-to-source capacitance.

A laser diode array 31 is series-connected with the parallel-connected FETs 25. By way of example only, the disclosed modulator was designed to drive the LDT-391 Laser Diode Array manufactured by M/A-COM LASER DIODE Inc. Output busses, as well as high density ground planes, are used to handle the large peak currents (up to 100 amperes). The parallel capacitances 32 are charged to 750 volts in the manner to be described and when the output FET switch (FETs 25) is enabled a large current pulse flows through the laser diode 31 and the twelve FETs 25 connected in series therewith. This short duration (20–200 nanoseconds) large current pulse enables the laser diode to provide a light pulse to a fiber optic cable, for example. The series-connected clamp diodes 33 (UES1306s) are necessary to protect both the laser diode and the FETs 25 against voltages greater than the supply voltage (+750 V.). The zener diode 34 absorbs kick-back energy to limit the voltage charge on capacitor 32 when the FET output switch turns off.

The coil 41 is inductively coupled to the lead or bus 40 and thus bus 40 and coil 41 serve as a transformer to couple a sample of the current burst to an output monitor (not shown) via a 51 ohm coaxial cable. A calibrated current monitor (10 amp/volt) will provide a view of the output pulse.

The afore-mentioned passive pull-down technique employs the 4-inch inductance loop 27. At the cessation of the pulser drive, the stored charge in inductance 27 collapses, the voltage across the same reverses, the charge is extracted from the input capacitance of the FETs 25, and the parallel FETs are effectively back-biased; as a consequence, the output current pulse is abruptly terminated. The value of the inductance 27 may also be changed to set the width of the current pulse within the limits of about 20–60 nanoseconds. For example, if inductance 27 is of a shorter length, a narrower current pulse will result. Alternatively, a single transistor "tail biter," functionally similar to the tail biter of SIR H275, can be substituted for the inductance 27. This will permit a wide range of current pulse widths.

The PFN in the drain of FET 18 also exercises control of the output pulse width. For example, if the length of the inductance 23 is increased, a longer duration current pulse will result. Conversely, if the inductance 23 is shortened, current pulse width is decreased. The recharge time constant of the PFN is set for 1.5 μsec to allow a 100 KHz operation.

The input supply voltage (+750 volts) is shunted by a 0.1 μf capacitance 51 and a zener diode 52 to clip off any over-shoot resulting from supply turn-on. The pass transistor 53 is biased hard to the ON state so as to provide a minimal drop to the load circuit. The enabled FET 53 couples the supply to the capacitances 32 via the 5.1 ohm resistance 54. The voltage drop developed across resistance 54 controls the bias of n-p-n transistor 55. If the voltage drop exceeds 500 millivolts for a duration of time (e.g., 0.1 millisecond) in excess of the time constant set by the base drive RC combination (resistance 56 and capacitance 57), transistor 55 turns on. This action triggers the gate of unijunction transistor 58 causing that device to avalanche. Thus the bias placed across pass transistor 53 is reduced to zero causing that device to open. A neon lamp 59 turns on indicating a current interrupt or trip. The supply voltage must be removed to re-set the circuit. For the stated use or purpose, the average current limit is set for 100 ma, the maximum allowed for the LDT-391 laser diode array. As will be evident to those in the art, the resistance 54 and/or the RC time constant can be changed for other and different average current limits. The pulse burst currents are, of course, far greater than the average current limit.

The laser diode modulator should preferably be integrated into a low inductance laser diode package employing power hybrid packaging (PHP) techniques. The drains of the FETs 25 can be heat sunk to a radiator on the top of the package or structure and to a boron nitride isolator pad on the ground plane of the structure. The modulator circuit can be used in any application requiring high-current with fast rise times. These applications include both the radar and laser fields.

The FET transistor types indicated in the drawing are commercially available devices and, moreover, are only given by way of example. As will be obvious to those in the art, other known transistor types may be readily substituted for those indicated in the FIGURE. This is also true for the diode types indicated in the FIGURE. The indicated values for the resistances, capacitances, and bias supplies are intended to be merely exemplary and the modulator of the invention is in no way limited thereto. Without further belaboring the point, it should be obvious at this time that the above-described arrangement is merely illustrative of the application and of the principles of the present invention and numerous modifications thereof may be devised by those skilled in the art without departing from the spirit and scope of the invention.

What is claimed is:

1. A laser diode modulator for generating a high current, short duration, pulse type signal in response to a low level voltage, input pulse signal comprising driver means responsive to said input pulse signal for generating a high amplitude current pulse of controlled predetermined width, a multiplicity of field effect transistors connected in parallel with said multiplicity being series connected with said laser diode, a high current source coupled to said laser diode, and means for coupling said current pulse to the gates of said field effect transistors to enable the same and thereby cause the flow of very high current from the source through the laser diode and multiplicity of field effect transistors.

2. A laser diode modulator as defined in claim 1 wherein said driver means includes pull-down means for abruptly disabling the field effect transistors when the current pulse coupled to the gates of said transistors ceases.

3. A laser diode modulator as defined in claim 2 wherein said driver means includes means for controlling the width of said current pulse.

4. A laser diode modulator as defined in claim 3 including a duty-sensitive overload circuit for setting a predetermined limit to the average current flow through the laser diode.

5. A laser diode modulator as defined in claim 4 wherein selected circuit components of said overload circuit can be changed to change said predetermined limit.

6. A laser diode modulator as defined in claim 5 wherein said multiplicity of field effect transistors comprises at least twelve in number.

* * * * *